United States Patent
Sasaki

(10) Patent No.: US 6,368,378 B2
(45) Date of Patent: Apr. 9, 2002

(54) PASTE TO BE FIRED FOR FORMING CIRCUIT BOARD AND METHOD FOR PREPARING SURFACE-MODIFIED SILVER POWDER

(75) Inventor: Takuya Sasaki, Yamaguchi (JP)

(73) Assignee: Mitsui Mining and Smelting Co., Ltd., Tokyo (JP)

( * ) Notice: Subject to any disclaimer, the term of this patent is extended or adjusted under 35 U.S.C. 154(b) by 0 days.

(21) Appl. No.: 09/742,350

(22) Filed: Dec. 22, 2000

(30) Foreign Application Priority Data

Dec. 22, 1999 (JP) .......................................... 11-364407

(51) Int. Cl.⁷ ................................................ B22F 1/00
(52) U.S. Cl. ....................................................... 75/252
(58) Field of Search ................... 75/741, 252; 252/514; 428/403; 427/216

(56) References Cited

U.S. PATENT DOCUMENTS 5,928,568 A * 7/1999 Paszkiet et al. ............. 252/512
6,060,165 A * 5/2000 Asada et al. ................. 428/403
6,265,090 B1 * 7/2001 Nishide et al. .............. 428/701

* cited by examiner

Primary Examiner—Ngoclan Mai
(74) Attorney, Agent, or Firm—Young & Thompson

(57) ABSTRACT

A paste to be fired at a temperature lower than melting point of silver for forming a circuit board comprising surface-modified silver powder consisting essentially of metal silver particles having an average particle size of not more than 10 $\mu$m and at least one member selected from the group consisting of oxides and double oxides containing at least one metal element selected from the group consisting of those belonging to Groups 2 to 14 of Periodic Table whose atomic number falls within the range of from 12 to 82, which is adhered to the surface of the individual metal silver particles. The surface-modified silver powder has an elevated sintering-initiation temperature and a reduced rate of heat shrinkage due to sintering. Therefore, the surface-modified silver powder is particularly suitable for use in making a circuit board, in particular an LTCC circuit board.

3 Claims, 1 Drawing Sheet

PASTE TO BE FIRED FOR FORMING CIRCUIT BOARD AND METHOD FOR PREPARING SURFACE-MODIFIED SILVER POWDER

BACKGROUND OF THE INVENTION (a) Field of the Invention

The present invention relates to a paste to be fired for forming a circuit board and methods for preparing surface-modified silver powder. More specifically, the invention relates to a paste to be fired at a temperature lower than the melting point of silver for forming a circuit board, in particular an LTCC (low-temperature cofired ceramic) circuit board which comprises surface-modified silver powder consisting essentially of metal silver particles and an oxide and/or a double oxide of a specified metal element adhered to the surface of the metal silver particles, as well as methods for preparing the surface-modified silver powder suitable for use in the paste.

(b) Description of the Prior Art

In recent years, LTCC package is going mainstream in mobile communication terminal and Bluetooth RF circuit that are proceeding toward downsizing and greater packaging density for attaining single chip mounting in the near future. In the LTCC package, passive parts are provided within a ceramic multi-layer circuit board and a semiconductor chip is mounted. This configuration makes it possible to integrate the entire RF circuit into one component.

In the LTCC package that has already become commercially practical, silver or copper is mainly used as the wiring material because of the electric characteristics. Such metal powder is kneaded with an organic binder to obtain a fired type of paste, which is used to commonly prepare the LTCC package by a process that includes screen-printing on a green sheet and firing simultaneously.

The metal powder for use in the fired type of paste as mentioned above is required to have properties such as low agglomeration and uniform particle size for higher accuracy in screen-printing and easier preparation of the fired type of paste. In addition, firing requires low heat shrinkage. We now consider the case where silver is used as metal powder. Silver powder has a melting point of 960° C., however, the sintering of silver powder is initiated at a temperature on the order of 500° C. and its shrinkage is initiated along with the initiation of the sintering. For this reason, in case where silver powder is used as a wiring material, one should take into consideration the difference in heat shrinkage behavior between the silver wiring formed and a member to be arranged behind the wiring. Under such circumstances, there has been proposed a technique for sufficiently increasing the sintering-initiation temperature of the silver powder and for controlling the heat shrinkage due to the sintering. The technique comprises the step of preparing a fired type of paste by incorporating inorganic oxide powder into the silver powder to thus control the heat shrinkage of the silver powder. However, this technique requires the addition of a large amount of inorganic oxide particles to the silver powder and there has been observed such a tendency that this would result in the deterioration of the electrical characteristics of the resulting wiring.

SUMMARY OF THE INVENTION

Accordingly, it is an object of the present invention to provide a paste to be fired at a temperature lower than the melting point of silver for forming a circuit board, in particular an LTCC circuit board, which can show an effect of inhibiting heat shrinkage due to sintering to the upper limit in a possible lowest amount of an oxide and/or a double oxide of a metal element by uniformly adhering the oxide and/or double oxide of a metal element to the surface of individual silver particles, without impairing any electrical characteristics of the silver powder. Another object of the present invention is to provide methods for preparing surface-modified silver powder suitable for use in the paste.

The inventors of this invention have conducted intensive studies to achieve the foregoing objects, have found that the foregoing objects can efficiently be accomplished by adhering an oxide and/or a double oxide of a specified metal element to the surface of individual metal silver particles to thus convert the silver powder into surface-modified silver powder and have thus completed the present invention.

According to a first aspect of the present invention, there is thus provided a paste to be fired at a temperature lower than melting point of silver fox forming a circuit board comprising surface-modified silver powder consisting essentially of metal silver particles having an average particle size of not more than 10 $\mu$m and at least one member selected from the group consisting of oxides and double oxides containing at least one metal element selected from the group consisting of those belonging to Groups 2 to 14 of Periodic Table whose atomic number falls within the range of from 12 to 82, which is adhered to the surface of the individual metal silver particles. Such silver powder is hereinafter simply referred to as "surface-modified silver".

According to one embodiment in a second aspect of the present invention, there is thus provided a method for preparing surface-modified silver powder comprising the steps of adding an aqueous solution containing at least one member selected from the group consisting of water-soluble salts of metal elements each having an atomic number ranging from 12 to 82 and belonging to Group 2 to 14 of Periodic Table to a slurry containing metal silver particles dispersed therein and then adjusting the pH of the mixture with an acid or an alkali to thus carry the metal oxide and/or double oxide derived from the water-soluble salt on the surface of the metal silver particles, According to another embodiment in the second aspect of the present invention, there is thus provided a method for preparing surface-modified silver powder comprising the steps of adhering at least one member selected from the group consisting of ultrafine particles of oxides and double oxides containing at least one metal element having an atomic number ranging from 12 to 82 and belonging to Group 2 to 14 of Periodic Table to the surface of metal silver particles and colliding the metal silver particles carrying the ultrafine particles adhered thereto with each other or other objects to thus carry the ultrafine particles on the surface of the metal silver particles.

According to still another embodiment in the second aspect of the present invention, there is thus provided a method for preparing surface-modified silver powder comprising the steps of mixing, with heating, a suspension containing at least one member dispersed therein and selected from the group consisting of ultrafine particles of oxides and double oxides containing at least one metal element having an atomic number ranging from 12 to 82 and belonging to Group 2 to 14 of Periodic Table with metal silver particles, removing the medium of the suspension to thus carry the ultrafine particles on the surface of the metal silver particles; and colliding the metal silver particles carrying the ultrafine particles adhered thereto with each other or other objects to thus carry the ultrafine particles on the surface of the metal silver particles.

BRIEF DESCRIPTION OF THE DRAWING

A single attached

DESCRIPTION OF THE PREFERRED EMBODIMENTS

Figure 1:
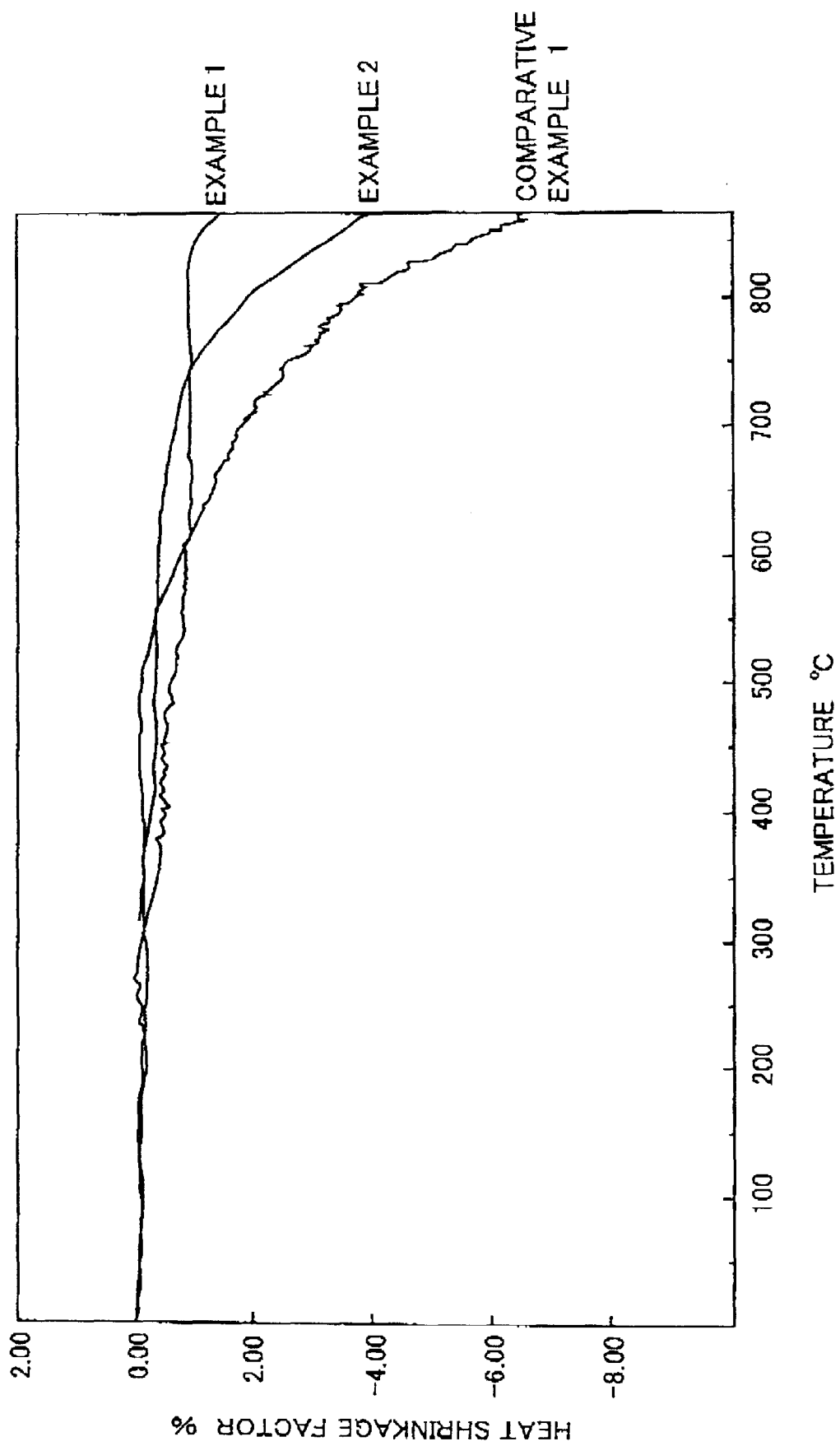
FIG. 1 is a graph showing the relation between the temperature and the heat shrinkage factor, determined in Example 1, Example 2 and Comparative Example 1 using a thermomechanical analysis device.

The fired type of paste according to the present invention is mainly intended to be used in forming circuits, for example inner electrodes and terminal electrodes of chip components including a chip inductor, a capacitor and so forth, in particular an LTCC circuit board. For this reason, the average particle size of metal silver particles serving as cores of the surface-modified silver powder should be not more than 10 $\mu$m and preferably 0.1 to 1 $\mu$m and the metal silver particle preferably has a spherical shape. The method for preparing such metal silver particles serving as cores is not restricted to any specific one and metal silver particles prepared by any known method can be used in the present invention.

In the surface-modified silver powder according to the present invention, at least one member selected from the group consisting of oxides and double oxides containing at least one metal element is adhered to the surface of individual metal silver particles. In this respect, the oxide and the double oxide comprise at least one metal element selected from the group consisting of those belonging to the Groups 2 to 14 of the Periodic Table whose atomic number falls within the range of form 12 to 82. In the surface-modified silver powder according to the present invention, the oxide and the double oxide are preferably those comprising at least one metal element selected from the group consisting of those belonging to the Groups 2 to 4, 7, 13 and 14 whose atomic number falls within the range of from 12 to 74. More preferably, the oxide and double oxide are preferably those containing at least one metal element selected from the group consisting of aluminum, silicon, zirconium, yttrium, magnesium and lanthanoid elements.

Specific examples of the foregoing oxides and double oxides are $MgO$, $CaO$, $SrO$, $BaO$, $ZnO$, $Al_2O_3$, $Ga_2O_3$, $Y_2O_3$, $SiO_2$, $TiO_2$, $ZrO_2$, $Cr_2O_3$, $MnO_2$, $Mn_3O_4$, $Nb_2O_5$, $BaTiO_3$, $CaTiO_3$, $SrTiO_3$, $BaZrO_3$, $CaZrO_3$, $SrZrO_3$, $(Mg, Ca)TiO_3$, $(Ba, Ca)(Ti, Zr)O_3$, $PbTiO_3$, $Pb(Zr, Ti)O_3$, $(Pb, Ca)TiO_3$, $MgAl_2O_4$, $BaTi_4O_9$, $Nd_2O_3$, $Sm_2O_3$, $Dy_2O_3$, $Er_2O_3$ and $Ho_2O_3$. Moreover, these oxides and/or double oxides may be doped with an oxide of a metal such as Nb, W, La, Y and/or Mo. These oxides and/or double oxides may be used alone or in any combination of at least two of them.

In the surface-modified silver powder used in the paste of the present invention, the preferred amount of the oxide and/or double oxide to be adhered to the surface of the individual metal silver particles may vary depending on the particle size of the metal silver particles. However, the adhered amount (this means the total adhered amount in case where at least two of the oxide and double oxide are used in combination) of the oxide and/or double oxide preferably ranges from 0.1 to 10% by mass, more preferably 0.5 to 8% by mass and still further preferably 1 to 7% by mass on the basis of the mass of the metal silver particles. If the adhered amount is less than 0.1% by mass, the effect of the present invention achieved by the adhesion of the oxide and/or double oxide is liable to be insufficient. On the other hand, if the adhered amount exceeds 10% by mass, the wiring formed using the paste containing such surface-modified silver powder would have such a tendency that the conductivity of the resulting wiring is insufficient.

The fired type of paste for use in forming the circuit, in particular LTCC circuit board according to the present invention must be used at a temperature lower than the melting point of silver and effectively functions when fired at a temperature of not less than 500° C. Further, in the fired type of paste for use in forming the LTCC circuit board, it is particularly preferable that the oxide and/or double oxide adhered to the surface of the metal silver particles have the same composition as the LTCC circuit board.

In respect of the surface-modified silver powder for use in the paste of the present invention, the oxide and/or double oxide can be adhered to the surface of individual metal silver particles according to a dry-adhering technique; a semi-dry-adhering technique, which comprises the steps of adhering an aqueous suspension containing ultrafine particles of an oxide or a double oxide of a metal to the surface of individual metal silver particles and then drying the silver particles; or a wet-adhering technique.

More specifically, the method for preparing the surface-modified silver powder for use in the paste of the present invention that is implemented according to the dry-adhering technique comprises the steps of adhering at least one member selected from the group consisting of ultrafine particles of oxides and double oxides containing at least one metal element selected from the group consisting of those belonging to the Groups 2 to 14 of the Periodic Table whose atomic number falls within the range of from 12 to 82 to the surface of individual metal silver particles and then leading the metal silver particles provided thereon with the ultrafine particles adhered thereto to collide with one another or with other bodies to thus form metal silver particles carrying, on the surface thereof, the ultrafine particles adhered thereto.

The smaller the particle size of the ultrafine particles of the oxide and double oxide, the smaller the amount of the ultrafine particles required for uniformly adhering them to the surface of the metal silver particles. Therefore, the particle size of the ultrafine particles is preferably not more than 0.5 $\mu$m, more preferably not more than 0.1 $\mu$m and most preferably not more than 0.05 $\mu$m.

The ultrafine particles of the oxide and/or double oxide can be adhered to the surface of the metal silver particles by a method comprising the steps of mixing the metal silver particles and the ultrafine particles of the oxide and/or double oxide and then leading the metal silver particles carrying the ultrafine particles adhered thereto to collide with one another or other bodies to thus firmly adhere the ultrafine particles to the surface of the silver particles. Alternatively, the adhesion of the ultrafine particles to the silver particles can likewise be performed by a method comprising the step of introducing the metal silver particles and the ultrafine particles of the oxide and/or double oxide into a device such as Angmill, Hybridizer, a mechanical fusion device, Coatmizer, a dispercoating device, Jetmizer, Sandmill or Mixmuller to thus simultaneously carry out the attachment and adhesion of the ultrafine particles to the metal silver particles.

When the method for preparing the surface-modified silver powder for use in the paste of the present invention is implemented according to the semi-dry-adhering technique, the ultrafine particles can be adhered to the surface of the metal silver particles by mixing, with heating, metal silver particles and a suspension containing at least one member selected from the group consisting of ultrafine particles of oxides and double oxides comprising at least one metal element selected from the group consisting of those belonging to the Groups 2 to 14 of the Periodic Table whose atomic number falls within the range of from 12 to 82; then removing the dispersion medium of the suspension to thus adhere the ultrafine particles to the surface of the metal silver particles; and leading the metal silver particles carrying the ultrafine particles adhered thereto to collide with one another or other bodies to thus firmly adhere the ultrafine particles to the surface of the silver particles.

The metal silver particles and the ultrafine particles of oxides and double oxides used in the semi-dry-adhering technique may be the same as those used in the dry-adhering technique. Further, the medium used to suspend the ultrafine particles is not limited to any particular type and in general, water, an acidic aqueous solution, a basic aqueous solution, an alcohol, an organic solvent or the like can be used. In this preparation method, a suspension having a specified solid content concentration may be prepared. Alternatively, commercially available Silicasol, Aluminasol, Titaniasol, Barium titanate sol and the like may be used and these products may be diluted as required for adjusting the concentration.

When the method for preparing the surface-modified silver powder for use in the paste of the present invention is implemented by the wet-adhering technique, there is added an aqueous solution containing at least one water-soluble salt of a metal element belonging to the Groups 2 to 14 of the Periodic Table whose atomic number falls within the range of from 12 to 82, such as those selected from the group consisting of halides, nitrates, sulfates, oxalates, oxides, and alkali metal salts of aluminic acid and silicic acid of these metal elements, and then the pH value of the resulting mixture is adjusted with either an acid or an alkali, and the mixture is optionally dried. The control of the pH value of the mixture permits the conversion of the foregoing water-soluble salt into an oxide or double oxide to thus allow the deposition and adhesion of the oxide or double oxide onto the surface of the metal silver particles and to thus form surface-modified silver powder. Moreover, the surface-modified silver powder thus prepared may if necessary be heat-treated to thus stabilize the oxide and/or double oxide.

When the method for preparing the surface-modified silver powder for use in the paste of the present invention is implemented by the wet-adhering technique, the pH adjusting agent may be selected from either acids or alkalis depending on the kinds of the foregoing water-soluble salts used, but the kinds of these acids and alkalis used are not limited to any specific one. For instance, a sodium hydroxide aqueous solution can be used if the oxides in the parenthesis are formed using the following water-soluble salts:

titanium sulfate ($TiO_2$); manganese sulfate ($MnO_2$);
chromium chloride ($Cr_2O_3$); yttrium chloride ($Y_2O_3$);
zirconium chloride oxide ($ZrO_2$).

Moreover, dilute sulfuric acid may be used if the oxides in the parenthesis are formed using the following water-soluble salts:

sodium aluminate ($Al_2O_3$); sodium silicate ($SiO_2$).

The foregoing water-soluble salts are converted by the pH adjustment into their oxides or double oxides and deposited on and carried on the surface of the metal silver particles to give the surface-modified silver powder for use in the paste of the present invention.

After adhering the metal oxide and/or double oxide derived from the foregoing water-soluble salt to the metal silver particles, washing the silver particles and drying the same, the metal silver particles carrying the oxide and/or double oxide adhered thereto are subjected to the following additional step. More specifically, the metal silver particles are treated in a device such as Angmill, Hybridizer, a mechanical fusion device, Coatmizer, a dispercoating device, Jetmizer, Sandmill or Mixmuller to thus lead the silver particles to collide with one another or other bodies. Thus, the adhesive strength between the metal silver particles and the oxide and/or double oxide present on the surface of the silver particles can substantially be improved.

The surface-modified silver powder of the present invention will hereunder be described in more detail with reference to the following working Examples and Comparative Examples, but the present invention is not restricted to these specific Examples at all.

Example 1

To 100 parts by mass of silver powder (having an average particle size of about 0.5 $\mu$m as determined by the SEM observation), there was added 5 parts by mass of aluminum oxide (having an averaged primary particle size of about 15 nm and a specific surface area of about 100 $m^2/g$), followed by sufficient stirring. Thus, there was prepared metal silver particles in which fine particulate aluminum oxide was adhered to the surface of the silver particles. Then the silver particles were introduced into Hybridizer (available from Nara Machinery Co., Ltd.) and circulated in the device at a rate of 8000 rpm for 5 minutes to thus give surface-modified silver powder in which fine particulate aluminum oxide was adhered to the surface of the metal silver particles. The fine particulate aluminum oxide was not released from the metal silver particles at all even if the surface-modified silver powder was dispersed in a solvent.

A pressure of 98 MPa was applied to 0.5 g of the surface-modified silver powder to thus mold the powder into a pellet having a diameter of 5 mm and a height of about 5 mm. This pellet was heated to 900° C. at a heating speed of 20° C./min in a nitrogen gas atmosphere using a thermo-mechanical analysis (TMA) device (TMA/SS6000, available from Seiko Instruments Inc.) to determine the heat shrinkage factor. The results obtained are shown in FIG. 1, while taking the thickness of a green compact prior to heating as a standard. As will be seen from the data shown in FIG. 1, the heat shrinkage factor was found to be only about 1%, even at a high temperature of 850° C.

Example 2

The same procedures used in Example 1 were repeated except that fine particulate silicon oxide (having an average primary particle size of about 7 nm and a specific surface area of about 300 $m^2/g$) was substituted for the fine particulate aluminum oxide used in Example 1 to give surface-modified silver powder in which the fine particulate silicon oxide was adhered to the surface of the metal silver particles.

A pressure of 98 MPa was applied to 0.5 g of the surface-modified silver powder to thus mold the powder into a pellet having a diameter of 5 mm and a height of about 5 mm. This pellet was heated to 900° C. using the same device and conditions as in Example 1 to determine the heat shrinkage factor. The results obtained are shown in FIG. 1, while taking the thickness of a green compact prior to heating as a standard. As will be seen from the data shown in FIG. 1, the heat shrinkage factor was found to be only about 3%, even at a high temperature of 850° C.

Example 3

To 4 liters of pure water in a stainless beaker, there was added 60 g of silver powder (having an average particle size of about 1 (m as determined by the SEM observation), followed by sufficiently stirring to give a slurry, heating the slurry to 60° C. and maintaining the slurry at that temperature. To the slurry, there was added, at a time, an aqueous solution preliminarily prepared by dissolving 17 g of sodium silicate solution (including 35 to 38% of $SiO_2$, a product of Kanto Kagaku) in 50 ml of pure water and the mixture was sufficiently stirred. Then, the mixture was neutralized with a solution of 18.5 g of concentrated sulfuric acid in 50 mL of pure water and stirred for one hour. Thereafter, the mixture was filtered through a Buchner funnel and fully dried to obtain a cake, which was then dried at 70° C. for 5 hours in a hot air drier. After drying, the cake was passed through a vibrating sieve (200-mesh) to obtain surface-modified silver powder in which $SiO_2$ is adhered to the surface of metal silver particles.

A pressure of 98 MPa was applied to 0.5 g of the surface-modified silver powder to thus mold the powder into a pellet having a diameter of 5 mm and a height of about 5 mm. This pellet was heated to 900° C. using the same device and conditions as in Example 1 to determine the heat shrinkage factor. The results obtained are based on the thickness of a green compact prior to heating, and the heat shrinkage factor was found to be only about 2.5%, even at a high temperature of 850° C.

Example 4

500 g of Silver powder (having an average particle size of about 1 (m as determined by the SEM observation) and 50 g of silica sol (Snow Tex O, available from Nissan Chemical Industries, Ltd.; content of $SiO_2$: 20% by mass; average particle size: 10 nm) were fully dispersed and mixed using a wet type dispersing machine. Then, the mixture was sufficiently stirred with heating. The water component was gradually evaporated and finally dry powder was obtained. Metal silver particles having $SiO_2$ ultrafine particles adhered to the surface thereof were thus obtained. The particles were then charged in Hybridizer (available from Nara Machinery Co., Ltd.) and processed by circulating it in the machine for 5 minutes at 8000 rpm to thus obtain surface-modified silver powder in which $SiO_2$ ultrafine particles are carried on the surface of the metal silver particles.

A pressure of 98 MPa was applied to 0.5 g of the surface-modified silver powder to thus mold the powder into a pellet having a diameter of 5 mm and a height of about 5 mm. This pellet was heated to 900° C. using the same device and conditions as in Example 1 to determine the heat shrinkage factor. The results obtained are based on the thickness of a green compact prior to heating, and the heat shrinkage factor was found to be only about 2%, even at a high temperature of 850° C.

Comparative Example 1

A pressure of 98 MPa was applied to 0.5 g of silver powder identical to that used in Example 1, but free of any oxide or double oxide adhered to the surface thereof to thus mold the silver powder into a pellet having a diameter of 5 mm and a height of about 5 mm. This pellet was heated to 900° C. using the same device and conditions as in Example 1 to determine the heat shrinkage factor. The results obtained are shown in FIG. 1, while taking the thickness of a green compact prior to heating as a standard. As will be seen from the data shown in FIG. 1, the heat shrinkage of the pellet was initiated at about 550° C. and the heat shrinkage factor thereof was found to be about 6% at 850° C.

As has been explained above in detail, the surface-modified silver powder for use in the paste of the present invention has an elevated sintering-initiation temperature and a reduced rate of heat shrinkage due to sintering. Therefore, the surface-modified silver powder for use in the paste of the present invention is particularly suitable for use in forming an LTCC circuit board.

What is claimed is:

1. A method for preparing surface-modified silver powder comprising the steps of adding an aqueous solution containing at least one member selected from the group consisting of water-soluble salts of metal elements each having an atomic number ranging from 12 to 82 and belonging to Group 2 to 14 of Periodic Table to a slurry containing metal silver particles dispersed therein and then adjusting the pH of the mixture with an acid or an alkali to thus Carry the metal oxide and/or double oxide derived from the water-soluble salt on the surface of the metal silver particles.

2. A method for preparing surface-modified silver powder comprising the steps of adhering at least one member selected from the group consisting of ultrafine particles of oxides and double oxides containing at least one metal element having an atomic number ranging from 12 to 82 and belonging to Group 2 to 14 of Periodic Table to the surface of metal silver particles and colliding the metal silver particles carrying the ultrafine particles adhered thereto with each other or other objects to thus carry the ultrafine particles on the surface of the metal silver particles.

3. A method for preparing surface-modified silver powder comprising the steps of mixing, with heating, a suspension containing at least one member dispersed therein and selected from the group consisting of ultrafine particles of oxides and double oxides containing at least one metal element having an atomic number ranging from 12 to 82 and belonging to Group 2 to 14 of Periodic Table with metal silver particles, removing the medium of the suspension to thus carry the ultrafine particles on the surface of the metal silver particles; and colliding the metal silver particles carrying the ultrafine particles adhered thereto with each other or other objects to thus carry the ultrafine particles on the surface of the metal silver particles.

* * * * *